United States Patent
Hsiao et al.

(10) Patent No.: US 11,770,100 B2
(45) Date of Patent: Sep. 26, 2023

(54) OSCILLATOR WITH TAPPED INDUCTOR

(71) Applicant: MEDIATEK INC., Hsin-Chu (TW)

(72) Inventors: Shuo-Yuan Hsiao, Hsinchu (TW); Manxia Xiao, Shanghai (CN)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/848,415

(22) Filed: Jun. 24, 2022

(65) Prior Publication Data

US 2023/0100708 A1 Mar. 30, 2023

Related U.S. Application Data

(60) Provisional application No. 63/247,814, filed on Sep. 24, 2021.

(30) Foreign Application Priority Data

May 23, 2022 (CN) .......................... 202210566775.X

(51) Int. Cl.
*H03B 5/12* (2006.01)
(52) U.S. Cl.
CPC .......... *H03B 5/1228* (2013.01); *H03B 5/1212* (2013.01); *H03B 2200/009* (2013.01)
(58) Field of Classification Search
CPC .................................................... H03B 5/1228
USPC ..................................................... 331/117 FE
See application file for complete search history.

(56) References Cited

U.S. PATENT DOCUMENTS

2008/0278250 A1* 11/2008 Hung .................. H03B 5/1215
455/552.1
2019/0372523 A1* 12/2019 Bushman ................ G06F 30/36

FOREIGN PATENT DOCUMENTS

| CN | 106998191 A | 8/2017 |
| EP | 3 157 167 A1 | 4/2017 |
| WO | 2021/081955 A1 | 5/2021 |

OTHER PUBLICATIONS

Ping Wing Lai, "A 2.4GHz SiGe Low Phase-Noise VCO Using On Chip Tapped inductor", pp. 505-508, ESSCIRC 2004—29th European Solid-State Circuits Conference. ,2004.

Yun-Hsueh Chuang, "Low Phase Noise Differential CMOS VCO Based on Tapped-Inductor Resonator", 2007 International Symposium on VLSI Design, Automation and Test (VLSI-DAT) ,2007.

Hao Guo ,"A 0.08mm2 25.5-to-29.9GHz Multi-Resonant-RLCM-Tank VCO Using a Single-Turn Multi-Tap Inductor and CM-Only Capacitors Achieving 191.6dBc/Hz FoM and 130kHz 1/f3 PN Corner", ISSCC 2019.

* cited by examiner

*Primary Examiner* — Joseph Chang
(74) *Attorney, Agent, or Firm* — Winston Hsu

(57) ABSTRACT

The present invention provides an oscillator including a tapped inductor and a cross-coupled pair. The tapped inductor includes a first terminal, a second terminal, a first tap and a second tap. The cross-coupled pair receives two input signals from the first terminal and the second terminal to generate two output signals to the first tap and the second tap, respectively.

13 Claims, 5 Drawing Sheets

$$V1 = L1\frac{di}{dt} + M12\frac{di}{dt} + M13\frac{di}{dt}$$

$$V2 = L2\frac{di}{dt} + M12\frac{di}{dt} + M23\frac{di}{dt}$$

$$V3 = L3\frac{di}{dt} + M13\frac{di}{dt} + M23\frac{di}{dt}$$

OSCILLATOR WITH TAPPED INDUCTOR

CROSS REFERENCE TO RELATED APPLICATIONS

This application claims the benefit of U.S. Provisional Application No. 63/247,814, filed on Sep. 24, 2021. The content of the application is incorporated herein by reference.

BACKGROUND

Recently, a low supply voltage has been a major solution for low-power system. However, for a digitally controlled oscillator (DCO) or a voltage-controlled oscillator (VCO), the low supply voltage results in a small swing of an oscillation signal, and a signal-to-noise ratio (SNR) will be worse accordingly.

SUMMARY

It is therefore an objective of the present invention to provide an oscillator whose output terminals of a cross-coupled pair are connected to taps of an inductor, which has lower power consumption, small chip are and lower phase noise, to solve the above-mentioned problems.

According to one embodiment of the present invention, an oscillator comprising a tapped inductor and a cross-coupled pair is disclosed. The tapped inductor comprises a first terminal, a second terminal, a first tap and a second tap. The cross-coupled pair receives two input signals from the first terminal and the second terminal to generate two output signals to the first tap and the second tap, respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
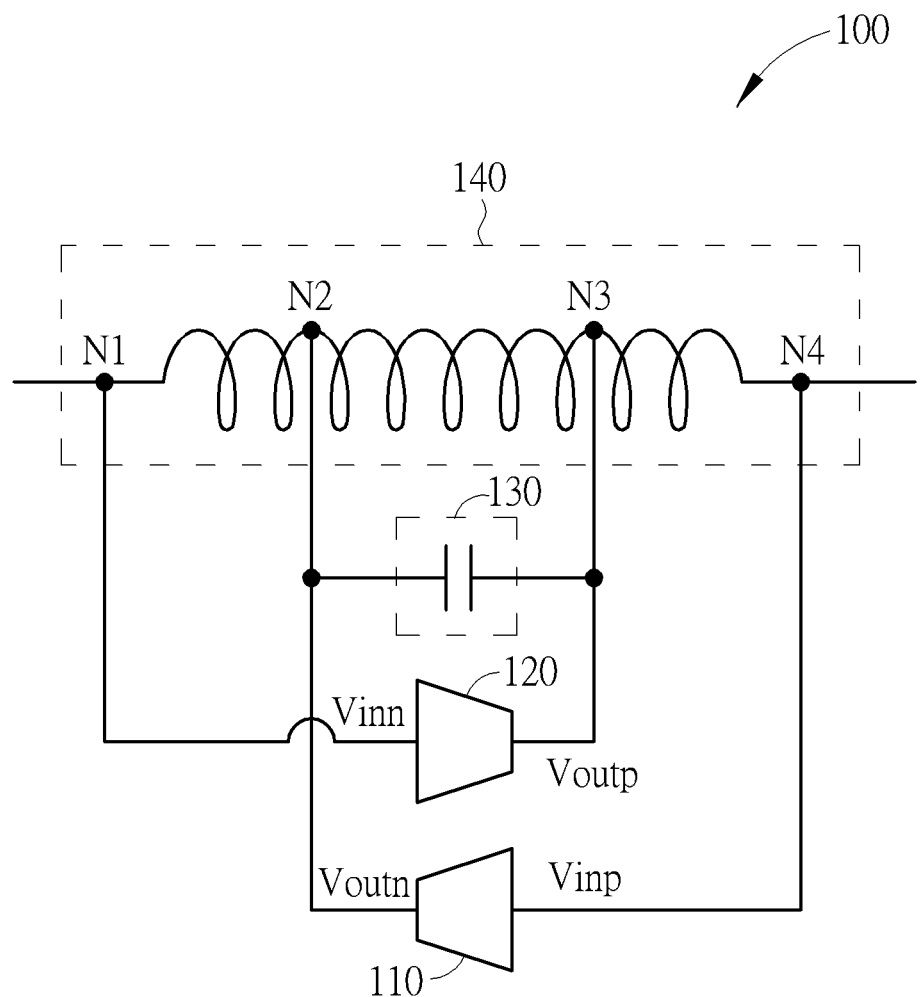
FIG. 1 is a diagram illustrating an oscillator according to one embodiment of the present invention.

FIG. 1 is a diagram illustrating an oscillator 100 according to one embodiment of the present invention. As shown in FIG. 1, the oscillator 100 comprises at least a cross-coupled pair including a first device 110 and a second device 120, a capacitor 130 and a tapped inductor 140. In this embodiment, two input signals Vinn and Vinp of the cross-coupled pair are coupled to two terminals N1 and N4 of the tapped inductor 140, and two output signals Voutn and Voutp of the cross-coupled pair are coupled to two taps N2 and N3 of the tapped inductor 140. Specifically, the first device 110 receives the input signal Vinp from the terminal N4 of the tapped inductor 140 to generate the output signal Voutn to the tap N2 of the tapped inductor 140, and the second device 120 receives the input signal Vinn from the terminal N1 of the tapped inductor 140 to generate the output signal Voutp to the tap N3 of the tapped inductor 140, wherein the two input signals Vinn and Vinp are differential signal, and the two out signals Voutn and Voutp are differential signal. In this embodiment, the oscillator 100 is a LC-tank digitally controlled oscillator (DCO) or voltage-controlled oscillator (VCO), and the two output signals Voutn and Voutp serve as oscillation signals of the oscillator 100.

Figure 2:
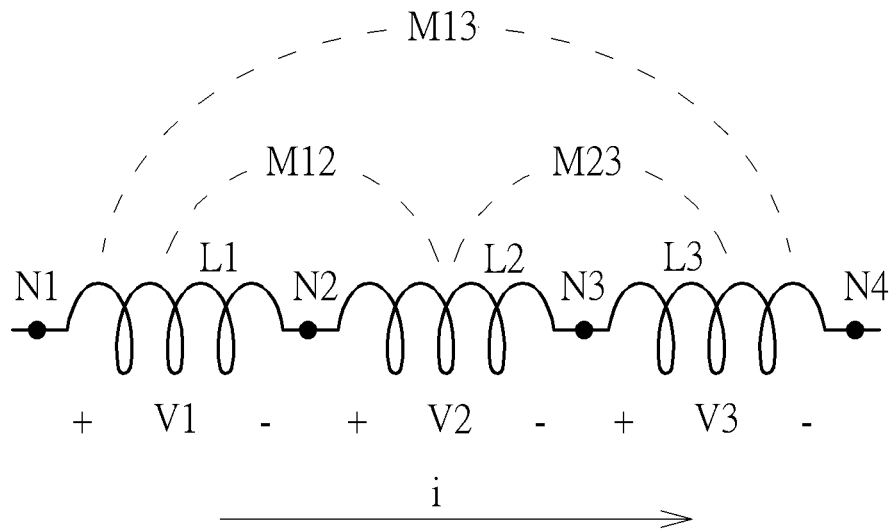
FIG. 2 is a diagram illustrating a tapped inductor within the oscillator according to one embodiment of the present invention.

In the embodiment shown in FIG. 1, the tapped inductor 140 of the oscillator 100 is a multi-turn tapped inductor, so the swing of the cross-coupled pair can be increased through its own mutual inductance, which in turn boosts the transconductance of the cross-coupled pair. Specifically, referring to FIG. 2, the tapped inductor 140 comprises several inductors connected in series (in this embodiment, the tapped inductor 140 comprises three inductors), wherein the first inductor having inductance L1 is coupled between the terminal N1 and the tap N2, the second inductor having inductance L2 is coupled between taps N2 and N3, and the third inductor having inductance L3 is coupled between the tap N3 and the terminal N4. In this embodiment, there is a mutual inductance M12 between the first inductor and the second inductor, a mutual inductance M23 between the second inductor and the third inductor, and a mutual inductance M13 between the first inductor and the third inductor, so total inductance of the tapped inductor 140 is equal to "L1+L2+L3+2*M12+2*M13+2*M23", and a voltage difference V1 between the terminal N1 and the tap N2, a voltage difference V2 between the taps N2 and N3, and a voltage difference V3 between the tap N3 and the terminal N4 can be expressly as follows, wherein the symbol "i" is a current flowing through the tapped inductor 140:

$$V1 = L1\frac{di}{dt} + M12\frac{di}{dt} + M13\frac{di}{dt}; \quad (1)$$

$$V2 = L2\frac{di}{dt} + M12\frac{di}{dt} + M23\frac{di}{dt}; \quad (2)$$

$$V3 = L3\frac{di}{dt} + M13\frac{di}{dt} + M23\frac{di}{dt}. \quad (3)$$

In the above formula (1)-(3), because the voltage differences V1, V2 and V3 (i.e., voltage cross the first/second/third inductor) are increased due to the mutual inductance M12/M13/M23, the voltage swings at the terminals N1 and N4 become larger, and the tranconductance of the cross-coupled pair is effectively increased.

In the embodiment shown in FIG. 1, the cross-coupled pair is connected to have a positive feedback which generates negative resistance to sustain oscillation. In the conventional art that the output signals of the cross-coupled pair are connected to the terminals N1 and N4, the negative resistance is equal to "−2/gm", wherein the term "gm" is the transconductance of the cross-coupled pair. In the embodiment of FIG. 1, the negative resistance is equal to "−2/(gm*(1+2α))", wherein the term "α" is a ratio between "V1" and "V2". Therefore, since oscillator 100 of this embodiment has better negative resistance than the conventional art, the quality factor of the oscillator 100 becomes better.

In light of above, because the transconductance of the cross-coupled pair of the oscillator 110 is increased at the same bias current, it can achieve the desired transconductance with low power consumption. In addition, because the quality factor of the oscillator 100 becomes better, the required quality factor can be achieved with a smaller chip area. Furthermore, the increased voltage swings at the terminals N1 and N4 result in lower phase noise.

Figure 3:
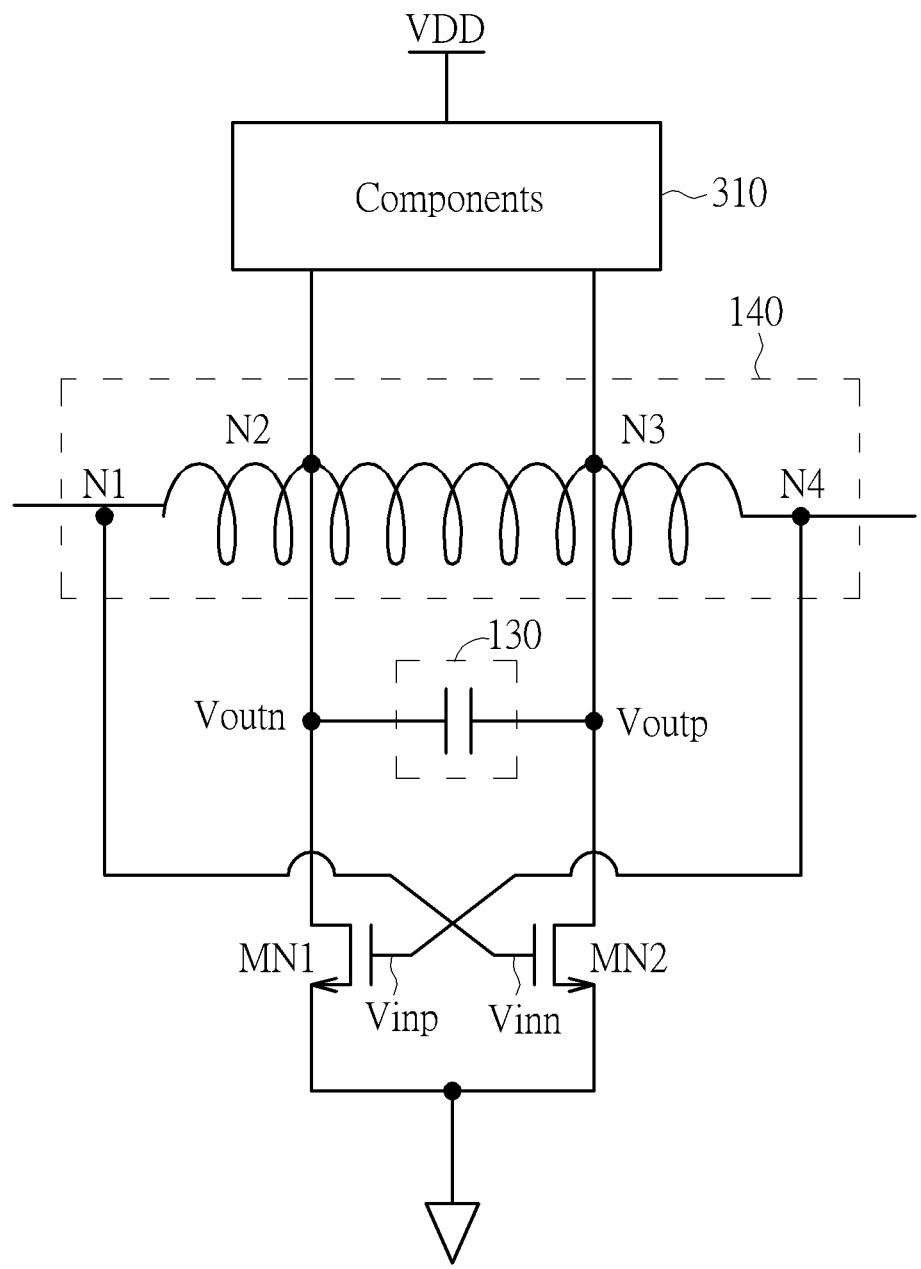
FIG. 3 is a diagram illustrating an oscillator according to one embodiment of the present invention.

In one embodiment, each of the first device 110 and the second device 120 can be implemented by a transistor as shown in FIG. 3. In FIG. 3, the first device 110 is implemented by a transistor (N-type transistor) MN1, wherein the transistor MN1 receives the input signal Vinp at a gate electrode to generate the output signal Voutn at a drain electrode; and the second device 120 is implemented by a transistor (N-type transistor) MN2, wherein the transistor MN2 receives the input signal Vinn at a gate electrode to generate the output signal Voutp at a drain electrode. In addition, each of the taps N2 and N3 of the tapped inductor 140 may be connected to a supply voltage VDD via components 310, wherein the components 310 may comprise a current source couple between the supply voltage VDD and the drain electrodes of the transistors MN1 and MN2; or the components 310 may comprise a P-type transistors couple between the supply voltage VDD and the drain electrodes of the transistors MN1 and MN2; or the components 310 may comprise another cross-coupled pair couple between the supply voltage VDD and the drain electrodes of the transistors MN1 and MN2. Because the present invention focuses on the connections between the first device 110, the second device 120 and the tapped inductor 140, and a person skilled in the art should understand how to implement the components 310, the details of the components 310 and other portions of the oscillator 100 are not described here.

Regarding the tapped inductor 140, in order to provide positive mutual inductance to boost the tanconductance of the cross-coupled pair, the tapped inductor 140 is designed to have multiple turns, and the inductors may share the same flux. Taking FIG. 2 as an example, the first inductor, the second inductor and the third inductor may have the same polarity, that is the terminal N1 may be a positive terminal for the first inductor, the tap N2 may be a positive terminal for the second inductor, and the tap N3 may be a positive terminal for the third inductor; or the terminal N1 may be a negative terminal for the first inductor, the tap N2 may be a negative terminal for the second inductor, and the tap N3 may be a negative terminal for the third inductor.

Figure 4:
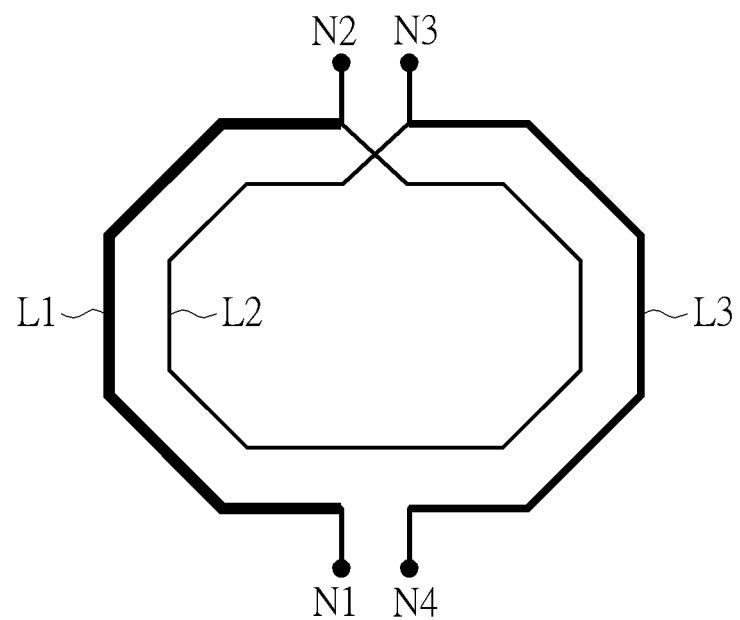
FIG. 4 is a diagram illustrating the tapped inductor according to a first embodiment of the present invention.

FIG. 4 is a diagram illustrating the tapped inductor 140 according to a first embodiment of the present invention. As shown in FIG. 4, the tapped inductor 140 has two turns, wherein the left half of the outer turn of the tapped inductor 140 corresponds to the first inductor having the inductance L1 shown in FIG. 2, the right half of the outer turn of the tapped inductor 140 corresponds to the third inductor having the inductance L3 shown in FIG. 2, and the inner turn of the tapped inductor 140 corresponds to the second inductor having the inductance L2 shown in FIG. 2.

Figure 5:
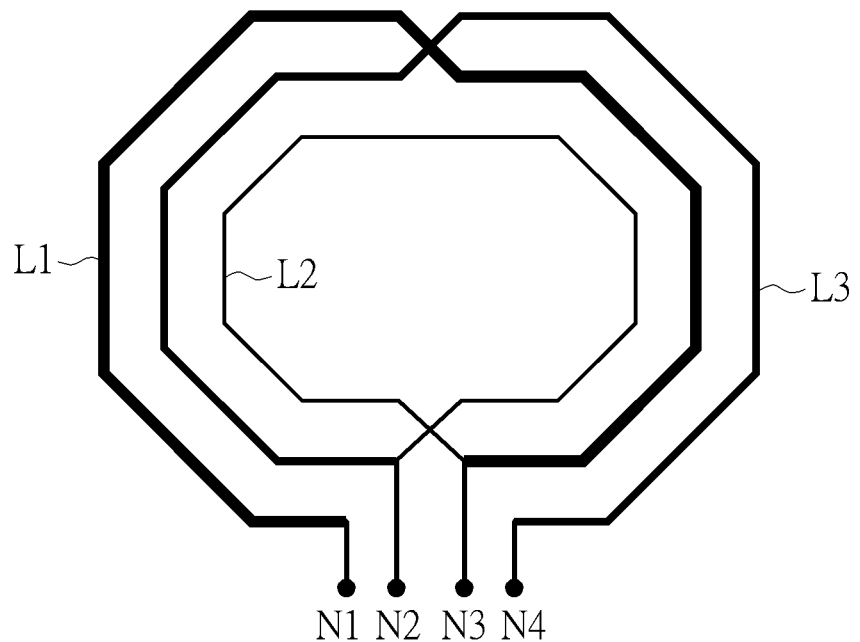
FIG. 5 is a diagram illustrating the tapped inductor according to a second embodiment of the present invention.

FIG. 5 is a diagram illustrating the tapped inductor 140 according to a second embodiment of the present invention. As shown in FIG. 5, the tapped inductor 140 has three turns, wherein the left half of the outer turn and the right half of the middle turn of the tapped inductor 140 corresponds to the first inductor having the inductance L1 shown in FIG. 2, the left half of the middle turn and the right half of the outer turn of the tapped inductor 140 corresponds to the third inductor having the inductance L3 shown in FIG. 2, and the inner turn of the tapped inductor 140 corresponds to the second inductor having the inductance L2 shown in FIG. 2.

Figure 6:
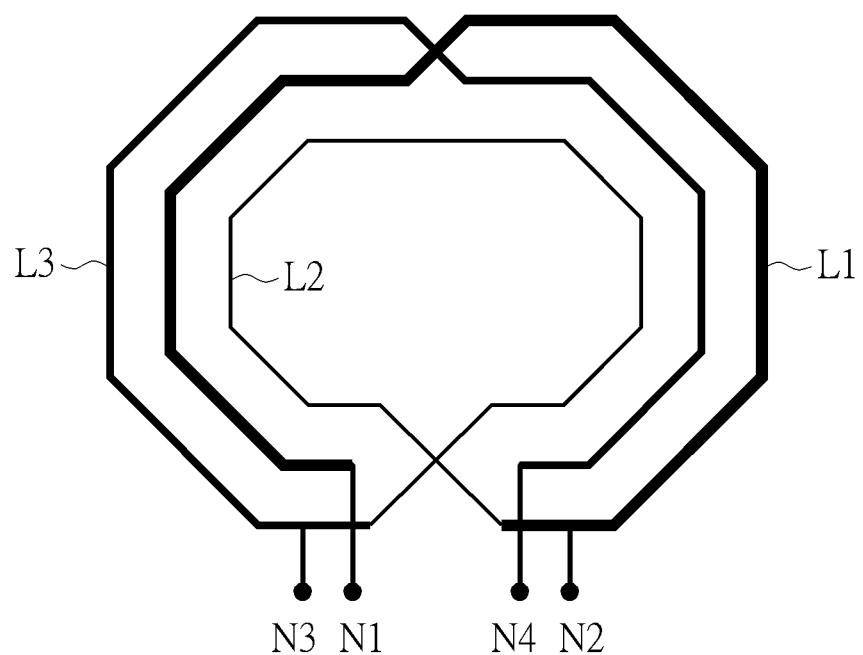
FIG. 6 is a diagram illustrating the tapped inductor according to a third embodiment of the present invention.

FIG. 6 is a diagram illustrating the tapped inductor 140 according to a third embodiment of the present invention. As shown in FIG. 6, the tapped inductor 140 has three turns, wherein the left half of the middle turn and the right half of the outer turn of the tapped inductor 140 corresponds to the first inductor having the inductance L1 shown in FIG. 2, the left half of the outer turn and the right half of the middle turn of the tapped inductor 140 corresponds to the third inductor having the inductance L3 shown in FIG. 2, and the inner turn of the tapped inductor 140 corresponds to the second inductor having the inductance L2 shown in FIG. 2.

Briefly summarized, in the oscillator of the present invention, by using the tapped inductor and connecting the output signals of the cross-coupled pair to the taps of the tapped inductor, the voltage swings at the terminals of the tapped inductor can be increased to lower the phase noise, and the transconductance of the cross-coupled pair can be increased accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator, comprising:
   a tapped inductor comprising a first terminal, a second terminal, a first tap and a second tap;
   a cross-coupled pair, wherein the cross-coupled pair receives two input signals from the first terminal and the second terminal to generate two output signals to the first tap and the second tap, respectively; and
   a capacitor coupled between the first tap and the second tap, wherein a first node of the capacitor is directly connected to the first tap, and a second node of the capacitor is directly connected to the second tap.

2. The oscillator of claim 1, wherein the two input signals comprise a first input signal and a second input signal, the two output signals comprise a first output signal and a second output signal, and the cross-coupled pair comprises a first device and a second device; and the first device receives the first input signal from the second terminal to generate the first output signal to the first tap, and the second device receives the second input signal from the first terminal to generate the second output signal to the second tap.

3. The oscillator of claim 2, wherein the first device is implemented by a first transistor, a gate electrode of the first transistor is coupled to the second terminal, and a drain electrode of the first transistor is coupled to the first tap; and the second device is implemented by a second transistor, a gate electrode of the second transistor is coupled to the first terminal, and a drain electrode of the second transistor is coupled to the second tap.

4. The oscillator of claim 1, wherein the tapped inductor is a multi-turn tapped inductor.

5. The oscillator of claim 1, wherein the tapped inductor comprises a first inductor, a second inductor and a third inductor connected in series, the first inductor is coupled between the first terminal and the first tap, the second inductor is coupled between the first tap and the second tap, and the third inductor is coupled between the second tap and the second terminal.

6. The oscillator of claim 5, wherein the two input signals comprise a first input signal and a second input signal, the two output signals comprise a first output signal and a second output signal, and the cross-coupled pair comprises a first device and a second device; and the first device receives the first input signal from the second terminal to generate the first output signal to the first tap, and the second device receives the second input signal from the first terminal to generate the second output signal to the second tap.

7. The oscillator of claim 6, wherein the first device is implemented by a first transistor, a gate electrode of the first transistor is coupled to the second terminal, and a drain electrode of the first transistor is coupled to the first tap; and the second device is implemented by a second transistor, a gate electrode of the second transistor is coupled to the first terminal, and a drain electrode of the second transistor is coupled to the second tap.

8. The oscillator of claim 5, wherein the first inductor, the second inductor and the third inductor have the same polarity.

9. The oscillator of claim 5, wherein the first terminal is a positive terminal for the first inductor, the first tap is a positive terminal for the second inductor, and the second tap is a positive terminal for the third inductor; or the first terminal is a negative terminal for the first inductor, the first tap is a negative terminal for the second inductor, and the second tap is a negative terminal for the third inductor.

10. An oscillator, comprising:
   a tapped inductor comprising a first terminal, a second terminal, a first tap and a second tap; and
   a cross-coupled pair, wherein the cross-coupled pair receives two input signals from the first terminal and the second terminal to generate two output signals to the first tap and the second tap, respectively; and
   wherein the tapped inductor comprises a first inductor, a second inductor and a third inductor connected in series, the first inductor is coupled between the first terminal and the first tap, the second inductor is coupled between the first tap and the second tap, and the third inductor is coupled between the second tap and the second terminal;
   wherein the first terminal is a positive terminal for the first inductor, the first tap is a positive terminal for the second inductor, and the second tap is a positive terminal for the third inductor; or the first terminal is a negative terminal for the first inductor, the first tap is a negative terminal for the second inductor, and the second tap is a negative terminal for the third inductor.

11. The oscillator of claim 10, wherein the two input signals comprise a first input signal and a second input signal, the two output signals comprise a first output signal and a second output signal, and the cross-coupled pair comprises a first device and a second device; and the first device receives the first input signal from the second terminal to generate the first output signal to the first tap, and the second device receives the second input signal from the first terminal to generate the second output signal to the second tap.

12. The oscillator of claim 11, wherein the first device is implemented by a first transistor, a gate electrode of the first transistor is coupled to the second terminal, and a drain electrode of the first transistor is coupled to the first tap; and the second device is implemented by a second transistor, a gate electrode of the second transistor is coupled to the first terminal, and a drain electrode of the second transistor is coupled to the second tap.

13. The oscillator of claim 10, wherein the tapped inductor is a multi-turn tapped inductor.

\* \* \* \* \*